US011456755B1

(12) United States Patent
Lo et al.

(10) Patent No.: US 11,456,755 B1
(45) Date of Patent: Sep. 27, 2022

(54) LOOK-UP TABLE COMPRESSION METHOD AND LOOK-UP TABLE READING METHOD FOR COMPUTATION EQUIPMENT AND ITS HOST AND DEVICE

(71) Applicant: NEUCHIPS CORPORATION, Hsinchu (TW)

(72) Inventors: Tzu-Jen Lo, Taipei (TW); Huang-Chih Kuo, Hsinchu (TW)

(73) Assignee: NEUCHIPS CORPORATION, Hsinchu (TW)

( * ) Notice: Subject to any disclaimer, the term of this patent is extended or adjusted under 35 U.S.C. 154(b) by 0 days.

(21) Appl. No.: 17/363,001

(22) Filed: Jun. 30, 2021

(30) Foreign Application Priority Data

May 10, 2021 (TW) ................... 110116680

(51) Int. Cl.
*H03M 7/42* (2006.01)
*H03M 7/30* (2006.01)
*G06N 3/063* (2006.01)

(52) U.S. Cl.
CPC .............. *H03M 7/42* (2013.01); *G06N 3/063* (2013.01); *H03M 7/3066* (2013.01)

(58) Field of Classification Search
CPC .............................. H03M 7/42; H03M 7/3066
(Continued)

(56) References Cited

U.S. PATENT DOCUMENTS 5,381,425 A * 1/1995 Bitzer ................... H03M 13/23
714/787

5,652,583 A * 7/1997 Kang ..................... H03M 7/42
341/60
(Continued)

FOREIGN PATENT DOCUMENTS

| CN | 108648136 | 10/2018 |
| CN | 109783008 | 5/2019 |

(Continued)

OTHER PUBLICATIONS

"Office Action of Taiwan Counterpart Application", dated Feb. 25, 2022, p. 1-p. 20.

*Primary Examiner* — Lam T Mai
(74) *Attorney, Agent, or Firm* — JCIPRNET (57) ABSTRACT

The disclosure provides a look-up table (LUT) compression method and a LUT reading method for computation equipment and its host and device. In a LUT compression phase, the host retrieves an original data from an original LUT by using an original table address, checks the original data according to a reconstruction condition to obtain a check result (bitmap), converts the original data into a reconstructed data according to the check result, writes the reconstructed data to a compressed LUT by using a compressed table address, writes a relationship among the original table address, the compressed table address, and the check result (bitmap) to a mapping table, and stores the compressed LUT to the device. In a LUT reading phase, the host retrieves a compressed table address and the bitmap from the mapping table by using an original table address, and the device retrieves a reconstructed data from the compressed LUT by using the compressed table address, and converts the reconstructed data into an original data according to the bitmap and a reconstruction condition.

42 Claims, 2 Drawing Sheets

(58) Field of Classification Search
USPC .................................................. 341/50–95
See application file for complete search history.

(56) References Cited

U.S. PATENT DOCUMENTS

| | | | | |
|---|---|---|---|---|
| 5,703,580 A * | 12/1997 | Ko | ..................... | H03M 5/145 |
| | | | | 341/59 |
| 6,008,847 A * | 12/1999 | Bauchspies | ........ | H04N 19/507 |
| | | | | 375/E7.231 |
| 6,349,152 B1 * | 2/2002 | Chaddha | ............. | H04N 19/90 |
| | | | | 375/E7.265 |
| 6,538,586 B1 * | 3/2003 | Cavin | ................. | H03M 7/30 |
| | | | | 341/106 |
| 6,807,137 B2 * | 10/2004 | Chuang | ............... | G11B 20/14 |
| 6,812,874 B1 * | 11/2004 | Johnson | ................. | G06J 1/00 |
| | | | | 341/110 |
| 2002/0014980 A1 * | 2/2002 | Rub | ..................... | H03M 7/00 |
| | | | | 341/59 |
| 2005/0174272 A1 * | 8/2005 | Cadambi | ............. | H04L 45/745 |
| | | | | 707/E17.036 |
| 2005/0231401 A1 * | 10/2005 | Perrone | ............... | G06K 9/6226 |
| | | | | 341/107 |
| 2010/0310065 A1 * | 12/2010 | Chang | ............... | H04N 21/2347 |
| | | | | 713/193 |
| 2011/0029753 A1 * | 2/2011 | Baptist | ............... | G06F 11/1076 |
| | | | | 711/170 |
| 2014/0297951 A1 * | 10/2014 | Baptist | ............... | G06F 11/1076 |
| | | | | 711/114 |
| 2014/0298137 A1 * | 10/2014 | Dhuse | ................ | G06F 11/3442 |
| | | | | 714/763 |
| 2015/0193545 A1 | 7/2015 | Sinha et al. | | |
| 2016/0350530 A1 * | 12/2016 | Wang | ..................... | G06F 21/78 |
| 2017/0026054 A1 * | 1/2017 | Nagata | .................... | G06F 17/40 |
| 2017/0286003 A1 | 10/2017 | Sala et al. | | |

FOREIGN PATENT DOCUMENTS

| | | |
|---|---|---|
| TW | 200832938 | 8/2008 |
| TW | 200838157 | 9/2008 |
| TW | I712884 | 12/2020 |

* cited by examiner

LOOK-UP TABLE COMPRESSION METHOD AND LOOK-UP TABLE READING METHOD FOR COMPUTATION EQUIPMENT AND ITS HOST AND DEVICE

CROSS-REFERENCE TO RELATED APPLICATION

This application claims the priority benefit of Taiwan application serial no. 110116680, filed on May 10, 2021. The entirety of the above-mentioned patent application is hereby incorporated by reference herein and made a part of this specification.

BACKGROUND

Technical Field

The disclosure relates to an electronic device, and particularly relates to a look-up table compression method and a look-up table reading method for computation equipment and its host and device.

Description of Related Art

In many applications, a host may transmit a large amount of data to a device. Taking artificial intelligence (AI) applications as an example, a computer (host) may transmit a large amount of data to an AI accelerator card (device). With such a large amount of data, the AI accelerator card may perform complex AI algorithms, and then send calculation results back to the computer. However, the transmission bandwidth between the host and the device is limited. How to reduce the data transmission amount between the host and the device is one of the issues being discussed in the art.

A look-up table (LUT) in which a large amount of data is stored in advance may be configured in the device to reduce the data transmission amount between the host and the device. For example, in an AI model, embedding tables are extensively used in computation equipment. In a large model, a data may be as long as one hundred bytes or more. By placing data in an embedding table (look-up table), a 64-bit (i.e., 8-byte) address (index) may represent a data of one hundred bytes or more. The host may transmit a 64-bit address to the device, and the device retrieves a data of one hundred bytes or more from the embedding table according to this address. Therefore, the host does not need to transmit a data of one hundred bytes or more to the device, and the data transmission amount between the host and the device is reduced. It is conceivable that the device needs a large storage space to store the embedding table (look-up table).

SUMMARY

The disclosure provides a look-up table compression method, a look-up table reading method, computation equipment using the methods, and its host and device, in order to reduce the data amount of a look-up table (LUT) and use a look-up table (compressed look-up table) with a reduced data amount.

In an embodiment of the disclosure, the look-up table compression method includes the following steps. An original data is retrieved from an original look-up table by using an original table address. The original data is checked according to a reconstruction condition to obtain a check result. The original data is converted into a reconstructed data according to the check result. The reconstructed data is written to a compressed look-up table by using a compressed table address. A relationship among the original table address, the compressed table address, and the check result is written to a mapping table.

In an embodiment of the disclosure, the computation equipment includes a device and a host. The host retrieves an original data from an original look-up table by using an original table address. The host checks the original data according to a reconstruction condition to obtain a check result. The host converts the original data into a reconstructed data according to the check result. The host writes the reconstructed data to a compressed look-up table by using a compressed table address. The host writes a relationship among the original table address, the compressed table address, and the check result to a mapping table. The host stores the compressed look-up table and the reconstruction condition to the device.

In an embodiment of the disclosure, the host includes a memory and a processor. The processor retrieves an original data from an original look-up table of the memory by using an original table address. The processor checks the original data according to a reconstruction condition to obtain a check result. The processor converts the original data into a reconstructed data according to the check result. The processor writes the reconstructed data to a compressed look-up table by using a compressed table address. The processor writes a relationship among the original table address, the compressed table address, and the check result to a mapping table. The processor stores the mapping table to the memory. The processor provides the compressed look-up table and the reconstruction condition to a device.

Based on the above, the computation equipment according to the embodiments of the disclosure may convert an original look-up table into a compressed look-up table according to a reconstruction condition. Therefore, the device may store the compressed look-up table by using a smaller storage space.

In an embodiment of the disclosure, the look-up table reading method includes the following steps. A compressed table address and a bitmap are retrieved from a mapping table by using an original table address. A reconstructed data is retrieved from a compressed look-up table by using the compressed table address. The reconstructed data is converted into an original data according to the bitmap and a reconstruction condition.

In an embodiment of the disclosure, the computation equipment includes a host and a device. The host retrieves a compressed table address and a bitmap from a mapping table by using an original table address. The device is coupled to the host to receive the compressed table address and the bitmap. The device retrieves a reconstructed data from a compressed look-up table by using the compressed table address. The device converts the reconstructed data into an original data according to the bitmap and a reconstruction condition.

In an embodiment of the disclosure, the device includes a memory and a processor. The processor receives a compressed table address and a bitmap from a host. The processor retrieves a reconstructed data from a compressed look-up table of the memory by using the compressed table address. The processor converts the reconstructed data into an original data according to the bitmap and a reconstruction condition.

In an embodiment of the disclosure, the host includes a memory and a processor. The processor retrieves a compressed table address and a bitmap from a mapping table of the memory by using an original table address. The processor provides the compressed table address and the bitmap to a device, so that the device retrieves a reconstructed data from a compressed look-up table by using the compressed table address, and the device converts the reconstructed data into an original data according to the bitmap and a reconstruction condition.

Based on the above, the host according to the embodiments of the disclosure may transmit a compressed table address and a bitmap to the device. The device may retrieve a reconstructed data from the compressed look-up table by using the compressed table address. Then, the device may convert the reconstructed data into an original data according to the bitmap and the reconstruction condition. Therefore, the computation equipment may use a look-up table (compressed look-up table) with a reduced data amount.

To make the aforementioned more comprehensible, several embodiments accompanied with drawings are described in detail as follows.

DESCRIPTION OF THE EMBODIMENTS

The term "couple or (connect)" used throughout the specification (including the claims) herein may refer to any direct or indirect connection means. For example, if a first device is described to be coupled (or connected) to a second device in the text, it is interpreted that the first device may be directly connected to the second device, or that the first device may be indirectly connected to the second device via other devices or some connection means. The terms "first", "second", etc. mentioned the specification (including the claims) herein are intended to name the elements or to distinguish among different embodiments or ranges, and are not intended to limit the upper or lower limit of the quantity of elements or limit the sequence of elements. Moreover, wherever possible, elements/components/steps labeled with the same reference numerals represent the same or similar parts in the drawings and embodiments. Reference may be made between the elements/components/steps labeled with the same reference numerals or described in the same terms in different embodiments for relevant descriptions.

Figure 1:
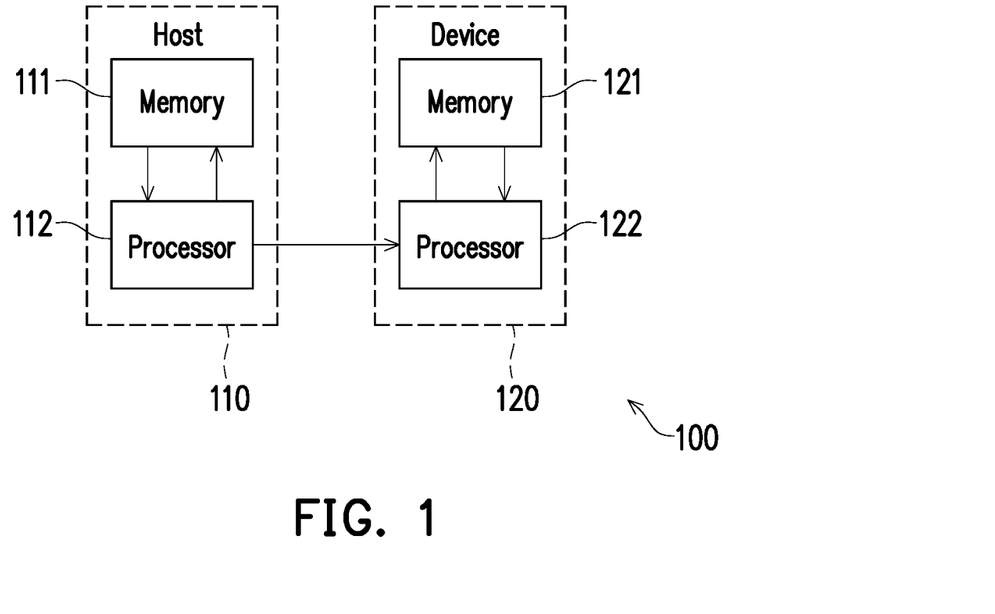
FIG. 1 is a schematic circuit block diagram showing computation equipment according to an embodiment of the disclosure.

FIG. 1 is a schematic circuit block diagram showing computation equipment 100 according to an embodiment of the disclosure. The computation equipment 100 includes a host 110 and a device 120. The host 110 and the device 120 may be any electronic products. For example, in some embodiments, the host 110 may be a computer, and the device 120 may be an artificial intelligence (AI) accelerator card. In other embodiments, the device 120 may be a wearable device or other electronic products. In many applications, the host 110 may transmit a large amount of data to the device 120. However, the transmission bandwidth between the host 110 and the device 120 is limited.

In some embodiments, a look-up table (LUT) in which a large amount of data is stored in advance may be configured in the device 120 so as to reduce the data transmission amount between the host 110 and the device 120. For example, an AI model may be recorded in an original look-up table, and this original look-up table may be configured in a memory 121 of the device 120. In a large model, a data may be as long as one hundred bytes or more. A processor 112 of the host 110 may transmit an address (index) to a processor 122 of the device 120, and the processor 122 may retrieve a data of one hundred bytes or more from the original look-up table of the memory 121 according to this address. Therefore, the host 110 does not need to transmit a data of one hundred bytes or more to the device 120, so that the data transmission amount between the host 110 and the device 120 is reduced. However, the storage space of the device 120 is limited. The original look-up table needs to be compressed to save storage space.

According to different design requirements, the processor 112 and/or the processor 122 may be implemented as a logic circuit on an integrated circuit. Alternatively, the processor 112 and/or the processor 122 may be implemented by using a hardware description language (e.g., Verilog HDL or VHDL) or other suitable programming languages. For example, the relevant functions of the processor 112 and/or the processor 122 may be implemented as various logic blocks, modules, and circuits in one or more controllers, microcontrollers, microprocessors, application-specific integrated circuits (ASIC), digital signal processors (DSP), field programmable gate arrays (FPGA), and/or other processing units.

The following embodiments will illustrate that, in the initialization period, the host 110 compresses an original look-up table, and then provides/transmits the compressed look-up table to the device 120. In another embodiment, the device 120 may compress the original look-up table (the operations of "the device 120 compresses the original look-up table" may be inferred from relevant descriptions of "the host 110 compresses the original look-up table" below), and then write the compressed look-up table back to the memory 121.

Figure 2:
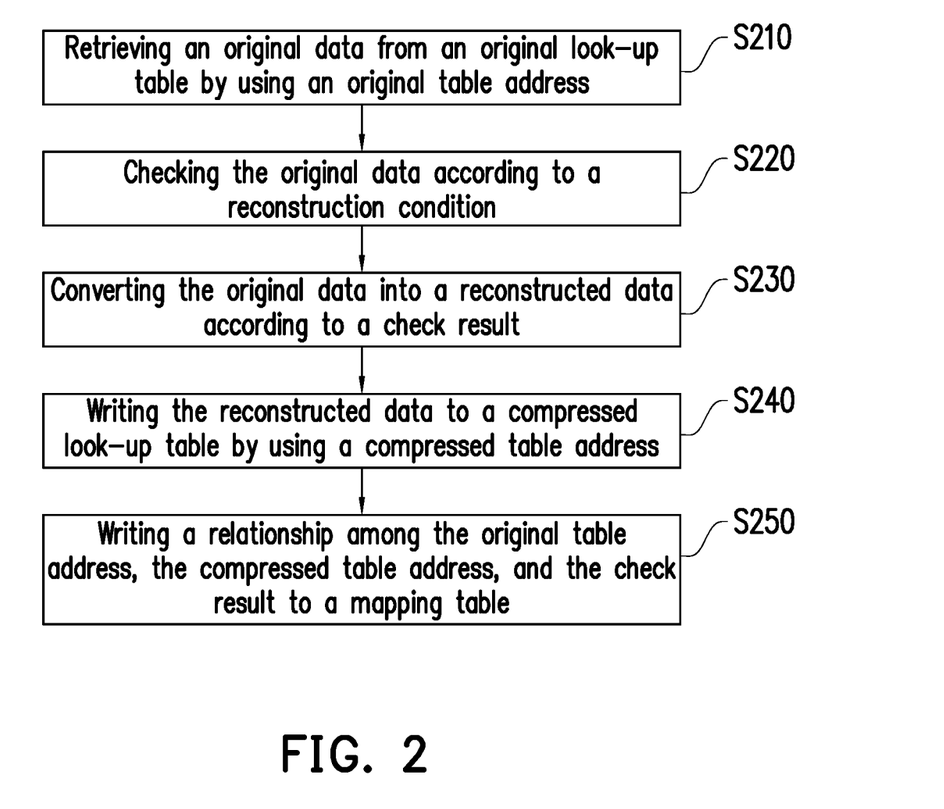
FIG. 2 is a flowchart showing a look-up table compression method according to an embodiment of the disclosure.

FIG. 2 is a flowchart showing a look-up table compression method according to an embodiment of the disclosure. In step S210, an original data is retrieved from an original look-up table by using an original table address. In step S220, the original data is checked according to a "reconstruction condition" to obtain a check result (also referred to as a bitmap). The reconstruction condition may be determined according to the actual design. For example, in some embodiments, the reconstruction condition includes "n bytes are a constant". In other embodiments, the reconstruction condition includes "n bytes are less than a threshold". In step S230, the original data is converted into a reconstructed data according to the check result. In step S240, the reconstructed data is written to a compressed look-up table by using a compressed table address. In step S250, a relationship among the original table address, the compressed table address, and the check result (bitmap) is written to a mapping table.

For example, referring to FIG. 1 and FIG. 2, the original look-up table may be stored in the memory 111 of the host 110. The processor 112 of the host 110 retrieves an original data from the original look-up table of the memory 111 by using an original table address. The processor 112 checks the original data according to a "reconstruction condition" to obtain a check result. The processor 112 converts the original data into a reconstructed data according to the check result. The processor 112 writes the reconstructed data to a compressed look-up table by using a compressed table address. The processor 112 of the host 110 writes a relationship among the original table address, the compressed table address, and the check result to a mapping table. After completing the establishment of the mapping table and the compressed look-up table, the processor 112 of the host 110 may store the mapping table to the memory 111 of the host 110, and the processor 112 of the host 110 may provide/transmit the compressed look-up table and the reconstruction condition to the processor 122 of the device 120. The processor 122 may store the compressed look-up table to the memory 121. After completing the establishment of the compressed look-up table and the mapping table, the processor 112 of the host 110 may remove the original look-up table in the memory 111 to save memory space.

Table 1 is a specific example of the original look-up table. In the initialization period, the original look-up table may be stored in the memory 111 of the host 110. The processor 112 of the host 110 retrieves an original data from the original look-up table of the memory 111 by using an original table address (step S210). For example, the processor 112 retrieves an original data "0x0000_0001" from Table 1 (i.e., the original look-up table) by using an original table address "0x000". Herein, "0x" represents a hexadecimal value.

TABLE 1

| Original look-up table | |
|---|---|
| Original table address | Original data |
| 0x000 | 0x0000_0001 |
| 0x004 | 0xdead_beef |
| 0x008 | 0x0000_0000 |
| 0x00c | 0xabcd_0000 |
| 0x010 | 0x0220_1215 |

The processor 112 checks the original data according to a "reconstruction condition" to obtain a check result (step S220). Here, "n bytes are a constant" is taken as an implementation example of the reconstruction condition, where n and the constant may be any real numbers according to the actual design. Taking the original data "0x0000_0001" at the original table address "0x000" shown in Table 1 as an example, when all of a portion of data (the data length is n bytes) in the original data "0x0000_0001" is the constant, a corresponding bit in the check result (bitmap) is set to a first logic state to indicate "satisfying the reconstruction condition". When not all of the portion of data is the constant, the corresponding bit in the check result (bitmap) is set to a second logic state to indicate "not satisfying the reconstruction condition".

For example, in some embodiments, n may be 2, and the constant may be 0. The processor 112 checks the original data "0x0000_0001" at the original table address "0x000" according to "2 bytes are all 0" (step S220). The original data "0x0000_0001" has 4 bytes, in which the first two bytes "0x0000" satisfy the "reconstruction condition", so the corresponding bit of the check result (bitmap) is "b'0" (although the logical value "0" is used here to indicate satisfying the reconstruction condition, other embodiments are not limited thereto); the last two bytes "0x0001" of the original data "0x0000_0001" do not satisfy the "reconstruction condition", so the corresponding bit of the check result (bitmap) is "b'1" (although the logical value "1" is used here to indicate not satisfying the reconstruction condition, other embodiments are not limited thereto). Therefore, the check result (bitmap) of the original data "0x0000_0001" at the original table address "0x000" is "b'01". Similarly, the check results (bitmaps) corresponding to the original table addresses "0x004", "0x008", "0x00c", and "0x010" shown in Table 1 are "b'11", "b'00", "b'10", and "b'11". Herein, b' represents a binary value.

The processor 112 may convert the original data into a reconstructed data according to the check result (bitmap) (step S230). For example, when the check result indicates that a portion of data in the original data satisfies the reconstruction condition, the portion of data is discarded; when the check result indicates that the portion of data does not satisfy the reconstruction condition, the portion of data is retained in the reconstructed data. Taking the original data "0x0000_0001" at the original table address "0x000" shown in Table 1 as an example, the check result (bitmap) is "b'01". In other words, the first two bytes "0x0000" of the original data "0x0000_0001" satisfy the "reconstruction condition", so the processor 112 may discard this portion of data "0x0000". The last two bytes "0x0001" of the original data "0x0000_0001" do not satisfy the "reconstruction condition", so the processor 112 may retain this portion of data "0x0001" in the reconstructed data. Similarly, the reconstructed data corresponding to the original table addresses "0x004", "0x00c", and "0x010" shown in Table 1 are "0xdead_beef", "0xabcd", and "0x0220_1215". The original data "0x0000_0000" at the original table address "0x008" all satisfies the "reconstruction condition", so the processor 112 may discard the original data "0x0000_0000".

The processor 112 writes the reconstructed data to a compressed look-up table by using a compressed table address (step S240). Table 2 is a specific example of the compressed look-up table. The processor 112 writes the reconstructed data "0x0001" to the compressed look-up table shown in Table 2 by using a compressed table address "0x000". Consecutively, the processor 112 writes the reconstructed data "0xdead_beef", "0xabcd", and "0x0220_1215" to the compressed look-up table shown in Table 2 by using compressed table addresses "0x002", "0x006", and "0x008", respectively.

TABLE 2

| Compressed look-up table | |
|---|---|
| Compressed table address | Reconstructed data |
| 0x000 | 0x0001_dead |
| 0x004 | 0xbeef_abcd |
| 0x008 | 0x0220_1215 |

The processor 112 of the host 110 may write a relationship among the original table address, the compressed table address, and the check result to a mapping table (step S250). Table 3 is a specific example of the mapping table. The processor 112 of the host 110 may write the relationship among the original table address shown in Table 1, the compressed table address shown in Table 2, and the check result (bitmap) of the original data shown in Table 1 to the mapping table shown in Table 3. "X" shown in Table 3 represents "don't care".

TABLE 3

| Mapping table | | |
|---|---|---|
| Original table address | Compressed table address | Bitmap |
| 0x000 | 0x000 | b'01 |
| 0x004 | 0x002 | b'11 |

TABLE 3-continued

| Mapping table | | |
|---|---|---|
| Original table address | Compressed table address | Bitmap |
| 0x008 | X | b'00 |
| 0x00c | 0x006 | b'10 |
| 0x010 | 0x008 | b'11 |

After completing the establishment of the mapping table shown in Table 3 and the compressed look-up table shown in Table 2, the processor 112 of the host 110 may store the mapping table shown in Table 3 to the memory 111 of the host 110, and the processor 112 of the host 110 may provide/transmit the compressed look-up table shown in Table 2 and the reconstruction condition "2 bytes are all 0" to the processor 122 of the device 120. The processor 122 may store the compressed look-up table shown in Table 2 to the memory 121. After completing the establishment of the compressed look-up table and the mapping table (i.e., the initialization period is over), the processor 112 of the host 110 may remove the original look-up table shown in Table 1 in the memory 111 to save memory space.

The above reconstruction condition "2 bytes are all 0" is one of many implementation examples of step S220. In other embodiments, the reconstruction condition in step S220 may be other conditions, such as "n bytes are less than a specific threshold", where n and the threshold may be any real numbers according to the actual design. Taking the original data "0x0000_0001" at the original table address "0x000" shown in Table 1 as an example, when a portion of data (the data length is n bytes) in the original data "0x0000_0001" shown in Table 1 is less than the threshold, a corresponding bit in the check result (bitmap) is set to a first logic state to indicate "satisfying the reconstruction condition". When the portion of data is not less than the threshold, the corresponding bit in the check result (bitmap) is set to a second logic state to indicate "not satisfying the reconstruction condition".

For example, in some embodiments, n may be 1, and the threshold may be 0x03. The processor 112 checks the original data "0x0000_0001" at the original table address "0x000" shown in Table 1 according to "1 byte is less than 0x03" (step S220). The values of the 4 bytes of the original data "0x0000_0001" are all less than the threshold "0x03", so the four corresponding bits of the check result (bitmap) are all "b'0" (although the logical value "0" is used here to indicate satisfying the reconstruction condition, other embodiments are not limited thereto). Therefore, the check result (bitmap) of the original data "0x0000_0001" at the original table address "0x000" is "b'0000". None of the 4 bytes of the original data "0xdead_beef" at the original table address "0x004" shown in Table 1 is less than the threshold "0x03", so the four corresponding bits of the check result (bitmap) are all "b'1" (although the logical value "1" is used here to indicate not satisfying the reconstruction condition, other embodiments are not limited thereto). Therefore, the check result (bitmap) of the original data "0xdead_beef" at the original table address "0x004" is "b'1111". Similarly, the check results (bitmaps) corresponding to the original table addresses "0x008", "0x00c", and "0x010" shown in Table 1 are "b'0000", "b'1100", and "b'0111".

The processor 112 may convert the original data into a reconstructed data according to the check result (bitmap) (step S230). Taking the original data "0x0000_0001" at the original table address "0x000" shown in Table 1 as an example, its check result (bitmap) is "b'0000". In other words, each of the 4 bytes of the original data "0x0000_0001" satisfies the reconstruction condition "1 byte is less than 0x03". Therefore, the processor 112 may discard the original data "0x0000_0001". None of the 4 bytes of the original data "0xdead_beef" at the original table address "0x004" shown in Table 1 satisfies the reconstruction condition "1 byte is less than 0x03". Therefore, the processor 112 may retain the original data "0xdead_beef" in the reconstructed data. Similarly, the processor 112 may discard the original data "0x0000_0000" at the original table address "0x008", the original data "0x0000" of "0x00e", and the original data "0x02" at the original table address "0x010" shown in Table 1, and retain the original data "0xabcd" at the original table address "0x00c" and the original data "0x20_1215" at the original table address "0x011" shown in Table 1 in the reconstructed data.

The processor 112 writes the reconstructed data to a compressed look-up table by using a compressed table address (step S240). Table 4 is another specific example of the compressed look-up table. The processor 112 writes the reconstructed data "0xdead_beef" to the compressed look-up table shown in Table 4 by using a compressed table address "0x000". Consecutively, the processor 112 writes the reconstructed data "0xabcd" and "0x20_1215" to the compressed look-up table shown in Table 4 by using compressed table addresses "0x004" and "0x006", respectively.

TABLE 4

| Compressed look-up table | |
|---|---|
| Compressed table address | Reconstructed data |
| 0x000 | 0xdead_beef |
| 0x004 | 0xabcd_2012 |
| 0x008 | 0x15... |

The processor 112 of the host 110 may write a relationship among the original table address, the compressed table address, and the check result to a mapping table (step S250). Table 5 is another specific example of the mapping table. The processor 112 of the host 110 may write the relationship among the original table address shown in Table 1, the compressed table address shown in Table 4, and the check result (bitmap) of the original data shown in Table 1 to the mapping table shown in Table 5. "X" shown in Table 5 represents "don't care".

TABLE 5

| Mapping table | | |
|---|---|---|
| Original table address | Compressed table address | Bitmap |
| 0x000 | X | b'0000 |
| 0x004 | 0x000 | b'1111 |
| 0x008 | X | b'0000 |
| 0x00c | 0x004 | b'1100 |
| 0x010 | 0x006 | b'0111 |

After completing the establishment of the mapping table shown in Table 5 and the compressed look-up table shown in Table 4, the processor 112 of the host 110 may store the mapping table shown in Table 5 to the memory 111 of the host 110, and the processor 112 of the host 110 may provide/transmit the compressed look-up table shown in Table 4 and the reconstruction condition "1 byte is less than 0x03" to the processor 122 of the device 120. The processor 122 may store the compressed look-up table shown in Table 4 to the memory 121. After completing the establishment of the compressed look-up table and the mapping table (i.e., the initialization period is over), the processor 112 of the host 110 may remove the original look-up table shown in Table 1 in the memory 111 to save memory space.

In summary of the above, the computation equipment 100 described in the above embodiments may convert an original look-up table into a compressed look-up table according to a reconstruction condition. Therefore, the device 120 may store the compressed look-up table by using a smaller storage space.

Figure 3:
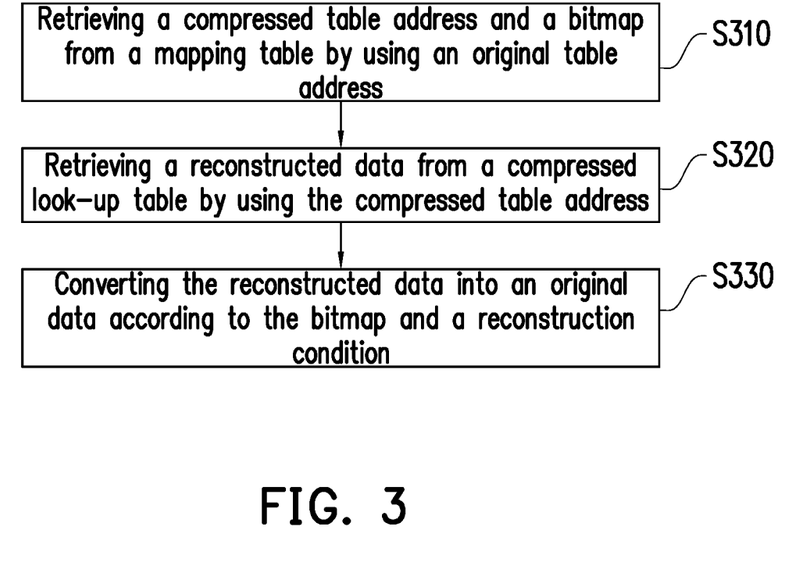
FIG. 3 is a flowchart showing a look-up table reading method according to an embodiment of the disclosure.

FIG. 3 is a flowchart showing a look-up table reading method according to an embodiment of the disclosure. In step S310, a compressed table address and a bitmap are retrieved from a mapping table by using an original table address. In step S320, a reconstructed data is retrieved from a compressed look-up table by using the compressed table address. In step S330, the reconstructed data is converted into an original data according to the bitmap and a reconstruction condition.

For example, referring to FIG. 1 and FIG. 3, the mapping table may be stored in the memory 111 of the host 110, and the compressed look-up table may be stored in the memory 121 of the device 120. The processor 112 of the host 110 retrieves the compressed table address and the bitmap from the mapping table of the memory 111 by using the original table address, and the processor 112 of the host 110 may provide the compressed table address and the bitmap to the processor 122 of the device 120 (step S310), so that the device 120 retrieves a reconstructed data from the compressed look-up table by using the compressed table address, and the device 120 converts the reconstructed data into an original data according to the bitmap and the reconstruction condition.

The processor 122 of the device 120 may receive the compressed table address and the bitmap from the host 110. In step S320, the processor 122 retrieves a reconstructed data from the compressed look-up table of the memory 121 by using the compressed table address. In step S330, the processor 122 may convert the reconstructed data into an original data according to the bitmap and the reconstruction condition. The "reconstruction condition" described in FIG. 3 may correspond to the "reconstruction condition" described in FIG. 2. For example, in some embodiments, the reconstruction condition includes "n bytes are a constant", where n and the constant may be any real numbers according to the actual design. In the case where the reconstruction condition is "n bytes are a constant", the operation of step S330 may include the following: when a corresponding bit in the bitmap is a first logic state, the constant is taken as a corresponding portion of data in the original data; and when the corresponding bit is a second logic state, a corresponding portion of data in the reconstructed data is retrieved as the corresponding portion of data in the original data.

For example, in some embodiments, in the reconstruction condition "n bytes are a constant", n may be 2, and the constant may be 0. Taking the compressed look-up table shown in Table 2 and the mapping table shown in Table 3 as an example, the processor 112 of the host 110 retrieves a compressed table address "0x000" and a bitmap "b'01" from the mapping table shown in Table 3 by using an original table address "0x000", and then provides the compressed table address "0x000" and the bitmap "b'01" to the processor 122 of the device 120 (step S310). The processor 122 retrieves a reconstructed data "0x0001" from the compressed look-up table shown in Table 2 by using the compressed table address "0x000" (step S320). The processor 122 may convert the reconstructed data "0x0001" into an original data "0x0000_0001" according to the bitmap "b'01" and the reconstruction condition "2 bytes are 0" (step S330). Specifically, since the first bit in the bitmap "b'01" is "b'0", the processor 122 takes "0x0000" (constant) as the first 2 bytes of the original data. Since the second bit in the bitmap "b'01" is "b'1", the processor 122 retrieves the reconstructed data "0x0001" as the last two bytes of the original data.

Therefore, according to the compressed table address "0x000" shown in Table 2 and the bitmap "b'01", the processor 122 may convert the reconstructed data "0x0001" into the original data "0x0000_0001". Similarly, the processor 112 of the host 110 retrieves a compressed table address "0x002" and a bitmap "b'11" from the mapping table shown in Table 3 by using an original table address "0x004", the processor 122 of the device 120 retrieves a reconstructed data "0xdead_beef" from the compressed look-up table shown in Table 2 by using the compressed table address "0x002", and then the processor 122 takes the reconstructed data "0xdead_beef" as an original data according to the bitmap "b'11". The processor 112 of the host 110 retrieves a bitmap "b'00" from the mapping table shown in Table 3 by using an original table address "0x008", and the processor 122 of the device 120 takes two "0x0000" (constant) as an original data according to the bitmap "b'00" and determines the original data as "0x0000 0000".

In other embodiments, the reconstruction condition includes "n bytes are less than a threshold". In the case where the reconstruction condition is "n bytes are less than a threshold", the operation of step S330 may include the following: when a corresponding bit in the bitmap is a first logic state, one or more real numbers which satisfy the threshold are taken as a corresponding portion of data in the original data; and when the corresponding bit is a second logic state, a corresponding portion of data in the reconstructed data is retrieved as the corresponding portion of data in the original data.

For example, in some embodiments, in the reconstruction condition "n bytes are less than a threshold", n may be 1, the threshold may be 0x03, and the real number may be any number less than the threshold "0x03". Taking the compressed look-up table shown in Table 4 and the mapping table shown in Table 5 as an example, the processor 112 of the host 110 retrieves a bitmap "b'0000" from the mapping table shown in Table 5 by using an original table address "0x000", and then provides the bitmap "b'0000" to the processor 122 of the device 120 (step S310). Since the 4 bits in the bitmap "b'0000" are all "b'0", the processor 122 takes four real numbers of 0x00 to 0x02 (e.g., "0x00", "0x00", "0x00", and "0x00") as an original data and determines the original data as "0x0000_0000". Compared with the original data "0x0000_0001" at the original table address "0x000" shown in Table 1, an error is present in the original data "0x0000_0000" decompressed by the processor 122. However, for some specific applications such as AI applications, an error less than a specific threshold is acceptable.

In other embodiments, the real number may be dynamically changed. When the reconstruction condition is "n bytes are less than a threshold", the device 120 may use any value that satisfies the threshold condition. For example, when the reconstruction condition is "1 byte is less than 0x03", the device 120 may fill in any value from 0x00 to 0x02. Taking the compressed look-up table shown in Table 4 and the mapping table shown in Table 5 as an example, the processor 112 of the host 110 retrieves a bitmap "b'0000" from the mapping table shown in Table 5 by using an original table address "0x000", and then provides the bitmap "b'0000" to the processor 122 of the device 120 (step S310). Since the 4 bits in the bitmap "b'0000" are all "b'0", the processor 122 takes four real numbers from 0x00 to 0x02 (e.g., "0x00", "0x02", "0x01", and "0x00") as an original data and determines the original data as "0x0002_0100". Compared with the original data "0x0000_0001" at the original table address "0x000" shown in Table 1, an error is present in the original data "0x0002_0100" decompressed by the processor 122. However, for some specific applications such as AI applications, an error less than a threshold (e.g., 0x03) is acceptable.

In summary of the above, the host 110 described in the above embodiments may transmit a compressed table address and a bitmap to the device 120. The device 120 may retrieve a reconstructed data from the compressed look-up table by using the compressed table address. Then, the device 120 may convert the reconstructed data into an original data according to the bitmap and the reconstruction condition. Therefore, the computation equipment 100 may use a look-up table (compressed look-up table) with a reduced data amount.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A look-up table compression method comprising:
   retrieving an original data from an original look-up table by using an original table address;
   checking the original data according to a reconstruction condition to obtain a check result;
   converting the original data into a reconstructed data according to the check result;
   writing the reconstructed data to a compressed look-up table by using a compressed table address; and
   writing a relationship among the original table address, the compressed table address, and the check result to a mapping table.

2. The look-up table compression method according to claim 1, further comprising:
   storing the mapping table to a host; and
   storing the compressed look-up table and the reconstruction condition to a device.

3. The look-up table compression method according to claim 2, wherein the host comprises a computer, and the device comprises an artificial intelligence accelerator card.

4. The look-up table compression method according to claim 1, wherein the reconstruction condition comprises that n bytes are a constant, and the operation of checking the original data comprises:
   when all of a portion of data in the original data is the constant, setting a corresponding bit in the check result to a first logic state, wherein a data length of the portion of data is n bytes; and
   when not all of the portion of data is the constant, setting the corresponding bit in the check result to a second logic state.

5. The look-up table compression method according to claim 4, wherein the constant comprises 0, and n is 2.

6. The look-up table compression method according to claim 1, wherein the reconstruction condition comprises that n bytes are less than a threshold, and the operation of checking the original data comprises:
   when a portion of data in the original data is less than the threshold, setting a corresponding bit in the check result to a first logic state, wherein a data length of the portion of data is n bytes; and
   when the portion of data is not less than the threshold, setting the corresponding bit in the check result to a second logic state.

7. The look-up table compression method according to claim 6, wherein the threshold comprises 0x03, and n is 1.

8. The look-up table compression method according to claim 1, wherein the operation of converting the original data into a reconstructed data comprises:
   when the check result indicates that a portion of data in the original data satisfies the reconstruction condition, discarding the portion of data; and
   when the check result indicates that the portion of data does not satisfy the reconstruction condition, retaining the portion of data in the reconstructed data.

9. Computation equipment comprising:
   a device; and
   a host which retrieves an original data from an original look-up table by using an original table address, wherein the host checks the original data according to a reconstruction condition to obtain a check result, the host converts the original data into a reconstructed data according to the check result, the host writes the reconstructed data to a compressed look-up table by using a compressed table address, the host writes a relationship among the original table address, the compressed table address, and the check result to a mapping table, and the host stores the compressed look-up table and the reconstruction condition to the device.

10. The computation equipment according to claim 9, wherein the host comprises a computer, and the device comprises an artificial intelligence accelerator card.

11. The computation equipment according to claim 9, wherein the reconstruction condition comprises that n bytes are a constant,
   when all of a portion of data in the original data is the constant, the host sets a corresponding bit in the check result to a first logic state, wherein a data length of the portion of data is n bytes, and
   when not all of the portion of data is the constant, the host sets the corresponding bit in the check result to a second logic state.

12. The computation equipment according to claim 11, wherein the constant comprises 0, and n is 2.

13. The computation equipment according to claim 9, wherein the reconstruction condition comprises that n bytes are less than a threshold,
   when a portion of data in the original data is less than the threshold, the host sets a corresponding bit in the check result to a first logic state, wherein a data length of the portion of data is n bytes, and
   when the portion of data is not less than the threshold, the host sets the corresponding bit in the check result to a second logic state.

14. The computation equipment according to claim 13, wherein the threshold comprises 0x03, and n is 1.

15. The computation equipment according to claim 9, wherein
   when the check result indicates that a portion of data in the original data satisfies the reconstruction condition, the host discards the portion of data, and
   when the check result indicates that the portion of data does not satisfy the reconstruction condition, the host retains the portion of data in the reconstructed data.

16. A host comprising:
a memory; and
a processor which retrieves an original data from an original look-up table of the memory by using an original table address, wherein the processor checks the original data according to a reconstruction condition to obtain a check result, the processor converts the original data into a reconstructed data according to the check result, the processor writes the reconstructed data to a compressed look-up table by using a compressed table address, the processor writes a relationship among the original table address, the compressed table address, and the check result to a mapping table, the processor stores the mapping table to the memory, and the processor provides the compressed look-up table and the reconstruction condition to a device.

17. The host according to claim 16, wherein after completing establishment of the compressed look-up table and the mapping table, the host removes the original look-up table in the memory.

18. The host according to claim 16, wherein the reconstruction condition comprises that n bytes are a constant,
when all of a portion of data in the original data is the constant, the processor sets a corresponding bit in the check result to a first logic state, wherein a data length of the portion of data is n bytes, and
when not all of the portion of data is the constant, the processor sets the corresponding bit in the check result to a second logic state.

19. The host according to claim 18, wherein the constant comprises 0, and n is 2.

20. The host according to claim 16, wherein the reconstruction condition comprises that n bytes are less than a threshold,
when a portion of data in the original data is less than the threshold, the processor sets a corresponding bit in the check result to a first logic state, wherein a data length of the portion of data is n bytes, and
when the portion of data is not less than the threshold, the processor sets the corresponding bit in the check result to a second logic state.

21. The host according to claim 20, wherein the threshold comprises 0x03, and n is 1.

22. The host according to claim 16, wherein
when the check result indicates that a portion of data in the original data satisfies the reconstruction condition, the processor discards the portion of data, and
when the check result indicates that the portion of data does not satisfy the reconstruction condition, the processor retains the portion of data in the reconstructed data.

23. A look-up table reading method comprising:
retrieving a compressed table address and a bitmap from a mapping table by using an original table address;
retrieving a reconstructed data from a compressed look-up table by using the compressed table address; and
converting the reconstructed data into an original data according to the bitmap and a reconstruction condition.

24. The look-up table reading method according to claim 23, wherein the mapping table is stored in a host, and the compressed look-up table is stored in a device, and the look-up table reading method further comprises:
providing, by the host, the compressed table address and the bitmap to the device.

25. The look-up table reading method according to claim 24, wherein the host comprises a computer, and the device comprises an artificial intelligence accelerator card.

26. The look-up table reading method according to claim 23, wherein the reconstruction condition comprises that n bytes are a constant, and the operation of converting the reconstructed data into the original data comprises:
when a corresponding bit in the bitmap is a first logic state, taking the constant as a corresponding portion of data in the original data; and
when the corresponding bit is a second logic state, retrieving a corresponding portion of data in the reconstructed data as the corresponding portion of data in the original data.

27. The look-up table reading method according to claim 26, wherein the constant comprises 0, and n is 2.

28. The look-up table reading method according to claim 23, wherein the reconstruction condition comprises that n bytes are less than a threshold, and the operation of converting the reconstructed data into the original data comprises:
when a corresponding bit in the bitmap is a first logic state, taking at least one real number that satisfies the threshold as a corresponding portion of data in the original data; and
when the corresponding bit is a second logic state, retrieving a corresponding portion of data in the reconstructed data as the corresponding portion of data in the original data.

29. The look-up table reading method according to claim 28, wherein the threshold comprises 0x03, the real number is less than the threshold, and n is 1.

30. Computation equipment comprising:
a host which retrieves a compressed table address and a bitmap from a mapping table by using an original table address; and
a device coupled to the host to receive the compressed table address and the bitmap, wherein the device retrieves a reconstructed data from a compressed look-up table by using the compressed table address, and the device converts the reconstructed data into an original data according to the bitmap and a reconstruction condition.

31. The computation equipment according to claim 30, wherein the host comprises a computer, and the device comprises an artificial intelligence accelerator card.

32. The computation equipment according to claim 30, wherein the reconstruction condition comprises that n bytes are a constant,
when a corresponding bit in the bitmap is a first logic state, the device takes the constant as a corresponding portion of data in the original data, and
when the corresponding bit is a second logic state, the device retrieves a corresponding portion of data in the reconstructed data as the corresponding portion of data in the original data.

33. The computation equipment according to claim 32, wherein the constant comprises 0, and n is 2.

34. The computation equipment according to claim 30, wherein the reconstruction condition comprises that n bytes are less than a threshold, and the operation of converting the reconstructed data into the original data comprises:
when a corresponding bit in the bitmap is a first logic state, the device takes at least one real number that satisfies the threshold as a corresponding portion of data in the original data, and
when the corresponding bit is a second logic state, the device retrieves a corresponding portion of data in the reconstructed data as the corresponding portion of data in the original data.

35. The computation equipment according to claim 34, wherein the threshold comprises 0x03, the real number is less than the threshold, and n is 1.

36. A device comprising:
a memory; and
a processor which receives a compressed table address and a bitmap from a host, wherein the processor retrieves a reconstructed data from a compressed look-up table of the memory by using the compressed table address, and the processor converts the reconstructed data into an original data according to the bitmap and a reconstruction condition.

37. The device according to claim 36, wherein the reconstruction condition comprises that n bytes are a constant,
when a corresponding bit in the bitmap is a first logic state, the processor takes the constant as a corresponding portion of data in the original data, and
when the corresponding bit is a second logic state, the processor retrieves a corresponding portion of data in the reconstructed data as the corresponding portion of data in the original data.

38. The device according to claim 37, wherein the constant comprises 0, and n is 2.

39. The device according to claim 36, wherein the reconstruction condition comprises that n bytes are less than a threshold, and the operation of converting the reconstructed data into the original data comprises:
when a corresponding bit in the bitmap is a first logic state, the processor takes at least one real number that satisfies the threshold as a corresponding portion of data in the original data, and
when the corresponding bit is a second logic state, the processor retrieves a corresponding portion of data in the reconstructed data as the corresponding portion of data in the original data.

40. The device according to claim 39, wherein the threshold comprises 0x03, the real number is less than the threshold, and n is 1.

41. A host comprising:
a memory; and
a processor which retrieves a compressed table address and a bitmap from a mapping table of the memory by using an original table address, wherein the processor provides the compressed table address and the bitmap to a device, so that the device retrieves a reconstructed data from a compressed look-up table by using the compressed table address, and the device converts the reconstructed data into an original data according to the bitmap and a reconstruction condition.

42. The host according to claim 41, wherein the host comprises a computer, and the device comprises an artificial intelligence accelerator card.

* * * * *